United States Patent
Kobayashi

(10) Patent No.: US 12,369,445 B2
(45) Date of Patent: Jul. 22, 2025

(54) LIGHT EMITTING APPARATUS, METHOD FOR MANUFACTURING LIGHT EMITTING APPARATUS, AND PROJECTOR

(71) Applicant: Seiko Epson Corporation, Tokyo (JP)

(72) Inventor: Koichi Kobayashi, Fujimi (JP)

(73) Assignee: SEIKO EPSON CORPORATION (JP)

( * ) Notice: Subject to any disclaimer, the term of this patent is extended or adjusted under 35 U.S.C. 154(b) by 513 days.

(21) Appl. No.: 17/580,710

(22) Filed: Jan. 21, 2022

(65) Prior Publication Data
US 2022/0238595 A1    Jul. 28, 2022

(30) Foreign Application Priority Data

Jan. 22, 2021    (JP) .................. 2021-008543

(51) Int. Cl.
*H10H 29/14*    (2025.01)
*G03B 21/20*    (2006.01)
(Continued)

(52) U.S. Cl.
CPC ....... *H10H 29/142* (2025.01); *G03B 21/2033* (2013.01); *H10H 20/01* (2025.01); *H10H 20/8312* (2025.01); *H10H 20/032* (2025.01)

(58) Field of Classification Search
CPC .... H10K 2102/00–361; G03B 21/2033; H01L 25/0753; H10H 29/142; H10H 20/01; H10H 20/8312; H10H 20/032; H10H 20/84; H10H 20/831; H10H 20/853; H10H 20/857
See application file for complete search history.

(56) References Cited

U.S. PATENT DOCUMENTS 11,398,507 B2    7/2022    Cheng et al.
2011/0169025 A1    7/2011    Kishino et al.
(Continued)

FOREIGN PATENT DOCUMENTS

CN    110416233 A    11/2019
JP    S62-60053 U    4/1987
(Continued)

*Primary Examiner* — Julio J Maldonado
*Assistant Examiner* — Stanetta D Isaac
(74) *Attorney, Agent, or Firm* — Harness, Dickey & Pierce, P.L.C.

(57) ABSTRACT

A light emitting apparatus according to an aspect of the present disclosure includes a substrate, a first light emitting section, a second light emitting section, a first electrode, a second electrode, a first protective layer, and a second protective layer. The area of the first electrode is greater than the area of the second electrode, the first protective layer has a first through hole, and the second protective layer has a second through hole. The first through hole has a first hole and a second hole, and the second through hole has a third hole and a fourth hole. A first opening area is greater than a second opening area, and a third opening area is greater than a fourth opening area of an opening of the fourth hole that is the opening closest to the substrate, the outer edge of the second opening overlaps with the first electrode, and the outer edge of the fourth opening overlaps with the second electrode. The second opening area is greater than the fourth opening area.

9 Claims, 5 Drawing Sheets

(51) Int. Cl.
    *H10H 20/01*    (2025.01)
    *H10H 20/831*    (2025.01)

(56) References Cited

U.S. PATENT DOCUMENTS

| | | |
|---|---|---|
| 2018/0083164 A1 | 3/2018 | Takenaka et al. |
| 2019/0198560 A1* | 6/2019 | Kaseya .............. G03B 21/2033 |
| 2020/0144326 A1* | 5/2020 | Lee ......................... H01L 27/15 |
| 2021/0066352 A1 | 3/2021 | Cheng et al. |

FOREIGN PATENT DOCUMENTS

| | | |
|---|---|---|
| JP | 2013-239718 A | 11/2013 |
| JP | 2018-049958 A | 3/2018 |
| JP | 2019-114739 A | 7/2019 |

\* cited by examiner

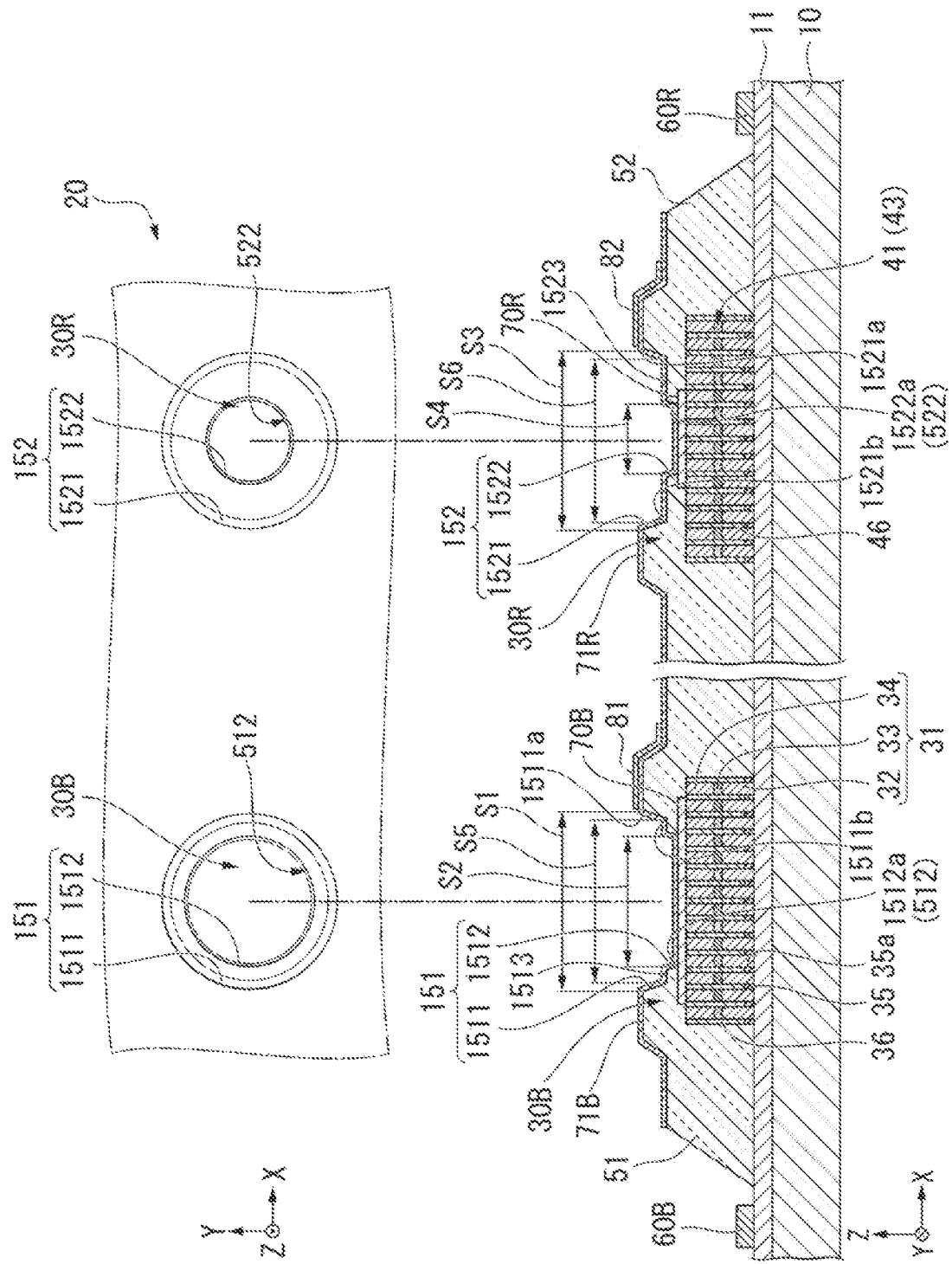

LIGHT EMITTING APPARATUS, METHOD FOR MANUFACTURING LIGHT EMITTING APPARATUS, AND PROJECTOR

The present application is based on, and claims priority from JP Application Serial Number 2021-008543, filed Jan. 22, 2021, the disclosure of which is hereby incorporated by reference herein in its entirety.

BACKGROUND

1. Technical Field

The present disclosure relates to a light emitting apparatus, a method for manufacturing the light emitting apparatus, and a projector.

2. Related Art

JP-A-2013-239718 discloses a light emitting apparatus including light emitting sections each formed of plurality of nanocolumns provided on a substrate. In the light emitting apparatus, the light emitting sections, which emit light beams having different colors, are formed on the substrate.

In the light emitting apparatus described above, it is conceivable that the light emitting sections, which emit light beams having different colors, have respective light emitting regions of different sizes. The size of each of the light emitting regions is determined by the diameter of an opening formed in a protective film that covers the light emitting section. It is therefore necessary to form a large opening in the protective film that covers a light emitting section having a large light emitting region and a small opening in the protective film that covers a light emitting section having a small light emitting region.

However, to form openings of different sizes in the protective films in an etching process, it is difficult to set a common etching rate. An etching period set so as to be suitable for an opening where the etching progresses quickly is not long enough for the other openings. Conversely, an etching period set so as to be suitable for an opening where the etching progresses slowly is too long for the other openings, so that the etching damages an underlying layer.

SUMMARY

To solve the problem described above, according to an aspect of the present disclosure, there is provided a light emitting apparatus including a substrate, a first light emitting section provided on the substrate, a second light emitting section provided on the substrate, a first electrode provided on a side of the first light emitting section that is a side opposite from the substrate, a second electrode provided on a side of the second light emitting section that is a side opposite from the substrate, a first protective layer that covers the first light emitting section and the first electrode, and a second protective layer that covers the second light emitting section and the second electrode. An area of the first electrode is greater than an area of the second electrode in a plan view viewed in a direction of a normal to the substrate. The first protective layer has a first through hole. The second protective layer has a second through hole. The first through hole has a first hole and a second hole located in a position shifted from the first hole toward the substrate. The second through hole has a third hole and a fourth hole located in a position shifted from the third hole toward the substrate. A first opening area of a first opening of the first hole, which is an opening farthest from the substrate, is greater than a second opening area of a second opening of the second hole, which is an opening closest to the substrate. A third opening area of a third opening of the third hole, which is an opening farthest from the substrate, is greater than a fourth opening area of a fourth opening of the fourth hole, which is an opening closest to the substrate. In the plan view, an outer edge of the second opening overlaps with the first electrode, and an outer edge of the fourth opening overlaps with the second electrode. The second opening area is greater than the fourth opening area.

According to another aspect of the present disclosure, there is provided a method for manufacturing a light emitting apparatus, the method including forming a first light emitting section and a second light emitting section on a substrate, forming a first electrode on a side of the first light emitting section that is a side opposite from the substrate, forming a second electrode having an area smaller than an area of the first electrode on a side of the second light emitting section that is a side opposite from the substrate, forming a first protective layer on the substrate so as to cover the first light emitting section and the first electrode, forming a second protective layer on the substrate so as to cover the second light emitting section and the second electrode, forming a first hole in a first position in the first protective layer where the first hole overlaps with the first electrode and another first hole in a second position in the second protective layer where the other first hole overlaps with the second electrode in a plan view viewed in a direction of a normal to the substrate, forming a second hole in a bottom surface of the first hole formed in the first position, the second hole having an opening area smaller than an opening area of the first hole, to form a first through hole that exposes part of the first electrode, and forming a third hole in a bottom surface of the first hole formed in the second position, the third hole having an opening area smaller than the opening area of the second hole, to form a second through hole that exposes part of the second electrode.

According to another aspect of the present disclosure, there is provided a projector including the light emitting apparatus according to the aspect described above.

BRIEF DESCRIPTION OF THE DRAWINGS

FIG. 3 shows the configurations of key parts of the light emitting device.

DESCRIPTION OF EXEMPLARY EMBODIMENTS

Figure 1:
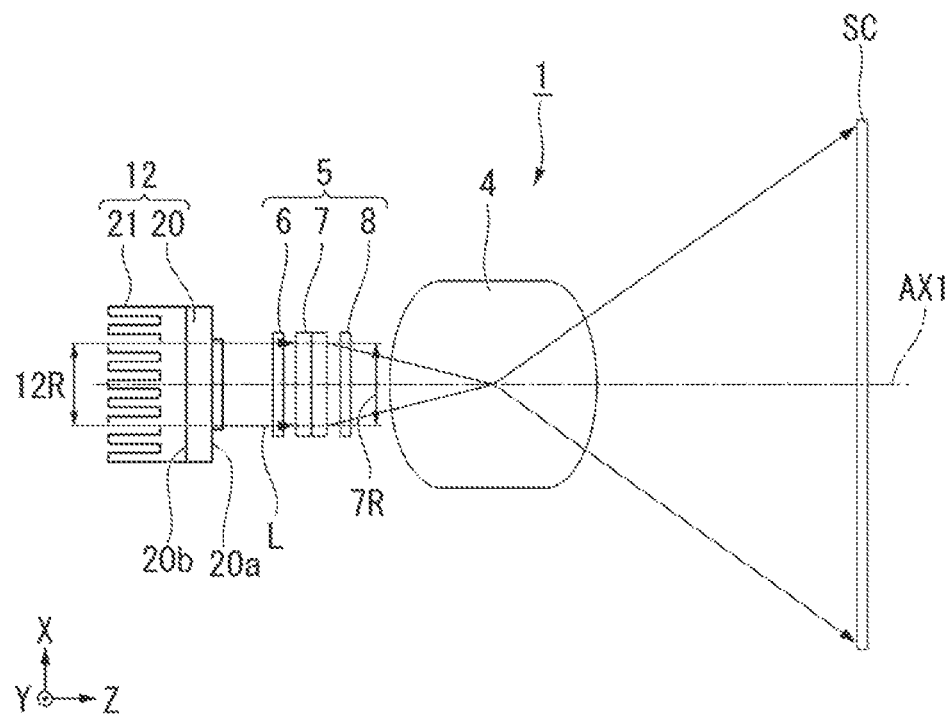
FIG. 1 is a schematic configuration diagram of a projector according to an embodiment.

An embodiment according to the present disclosure will be described below with reference to the drawings. In the following drawings, components are drawn at different dimensional scales in some cases for clarification of each of the components. FIG. 1 is a schematic configuration diagram of a projector according to the present embodiment.

A projector 1 according to the present embodiment is a projection-type image display apparatus that displays an image on a screen SC, as shown in FIG. 1. The projector 1 includes a light emitting apparatus 12, a light modulating apparatus 5, and a projection optical apparatus 4. The configuration of the light emitting apparatus 12 will be described later in detail.

An optical axis which coincides with a normal passing through the center of a light emitting region 12R of the light emitting apparatus 12 and along which the chief ray of a luminous flux L outputted from the light emitting region 12R travels is hereinafter referred to as an optical axis AX1.

The configuration of each of the apparatuses of the projector 1 will be described below by using an XYZ orthogonal coordinate system. The orthogonal coordinate system has an axis X parallel to the long sides of the light emitting region 12R, which has a rectangular planar shape when viewed in the direction of the optical axis AX1, an axis Y parallel to the short sides of the light emitting region 12R, and an axis Z perpendicular to the axes X and Y. The axis Z is parallel to the optical axis AX1.

The light modulating apparatus 5 modulates the luminous flux L outputted from the light emitting apparatus in accordance with image information to generate image light. The light modulating apparatus 5 includes a light-incident-side polarizer 6, a liquid crystal display device 7, and a light-exiting-side polarizer 8. An image formation region 7R of the liquid crystal display device 7 has a rectangular planar shape when viewed in the axis-Z direction. The light emitting region 12R of the light emitting apparatus 12 has a rectangular planar shape as described above, and the planar shape of the image formation region 7R is substantially similar to the planar shape of the light emitting region 12R. The area of the light emitting region 12R is equal to or slightly greater than the area of the image formation region 7R.

The projection optical apparatus 4 projects the image light outputted from the light modulating apparatus 5 onto a projection receiving surface, such as the screen SC. The projection optical apparatus 4 is formed of a single projection lens or a plurality of projection lenses.

The light emitting apparatus 12 according to the present embodiment will be described below.

The light emitting apparatus 12 includes a light emitting device 20 and a heat sink 21, as shown in FIG. 1. The light emitting device 20 has a first surface 20a and a second surface 20b and outputs the luminous flux L via the first surface 20a. The heat sink 21 is provided at the second surface 20b of the light emitting device 20 to dissipate heat generated by the light emitting device 20. The heat sink 21 may be omitted as required.

Figure 2:
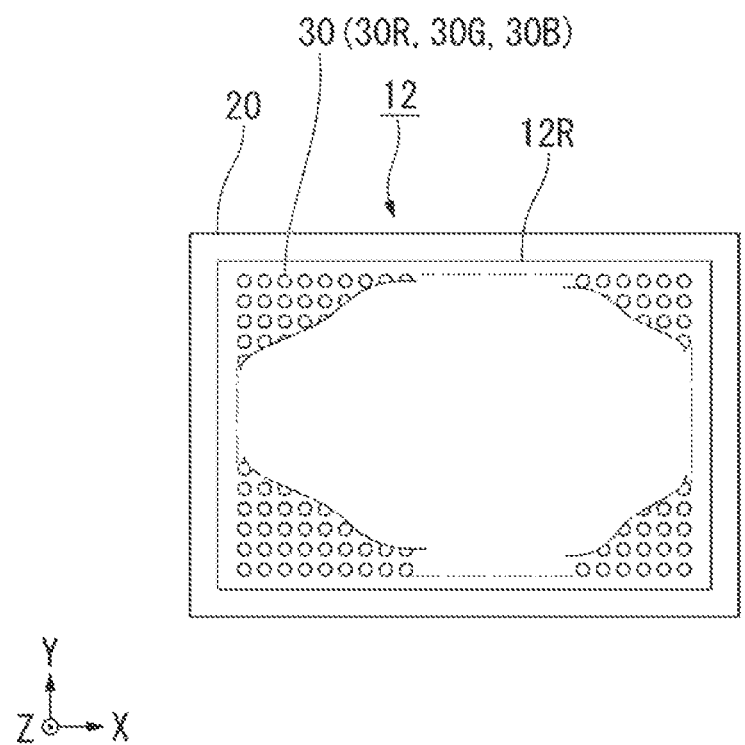
FIG. 2 is a plan view showing a schematic configuration of a light emitting device.

FIG. 2 is a plan view showing a schematic configuration of the light emitting device 20. FIG. 2 shows only part of light emitting sections 30 in the light emitting region 12R of the light emitting device 20, and does not show the other light emitting sections 30 for clarity of illustration.

The light emitting device 20 includes a plurality of light emitting sections 30 provided in an array as shown in FIG. 2. In the present embodiment, the light emitting sections are provided in a matrix along the axes X and Y. The plurality of light emitting sections 30 include red light emitting sections 30R, which emit red light, green light emitting sections 30G, which emit green light, and blue light emitting sections 30B, which emit blue light. The light emitting apparatus 12 according to the present embodiment can form a self-luminous imager that forms video images with the light emitting sections 30 serving as pixels.

In the present embodiment, the white balance of the video images is adjusted by configuring the light emitting area of the blue light emitting sections 30B to be larger than that of the red light emitting sections 30R. The light emitting areas of the red light emitting sections 30R and the green light emitting sections 30G are set to be equal to each other.

FIG. 3 shows the configurations of key parts of the light emitting device 20. FIG. 3 shows a portion including the blue light emitting section 30B and the red light emitting section 30R out of the plurality of light emitting sections 30. The upper part of FIG. 3 is a plan view of the blue light emitting section 30B and the red light emitting section 30R viewed from the side +Z, and the lower part of FIG. 3 is a cross-sectional view of the blue light emitting section 30B and the red light emitting section 30R.

The light emitting device 20 includes a base (substrate) 10, a semiconductor layer 11, the blue light emitting sections (first light emitting section) 30B, the red light emitting sections (second light emitting section) 30R, a first protective layer 51, a second protective layer 52, a lower-layer electrode 60B, an upper-layer electrode (first electrode) 70B, a drawn electrode 71B, a lower-layer electrode 60R, an upper-layer electrode (second electrode) 70R, a drawn electrode 71R, first wiring 81, and second wiring 82, as shown in FIG. 3.

In the description of the present embodiment, the direction in which nanocolumns that will be described later and form the blue light emitting sections 30B and red light emitting sections 30R are laminated on the base 10 is called an "upper" side of the axis-Z direction, and the direction from the base 10 toward the side opposite from the blue light emitting sections 30B and red light emitting sections 30R is called a "lower" side of the axis-Z direction.

The base 10 is a substrate primarily formed, for example, of a silicon (Si) substrate, a gallium nitride (GaN) substrate, or a sapphire substrate. A reflection layer is formed on the surface of the base 10, and the reflection layer is, for example, a laminate in which AlGaN layers and GaN layers are alternately laminated on each other or a laminate in which AlInN layers and GaN layers are alternately laminated on each other. The reflection layer reflects light generated by light emitting layers of the blue light emitting section 30B and the red light emitting section 30R, which will be described later, toward the side opposite from the base 10.

The semiconductor layer 11 is provided on the base 10. The semiconductor layer 11 is formed, for example, of an n-type GaN layer, specifically, a GaN layer to which Si has been doped.

The plurality of light emitting sections 30 shown in FIG. 2 are provided in the form of islands on the base 10 via the semiconductor layer 11. Light emitting sections 30 adjacent to each other are electrically isolated from each other by a device isolation layer (not shown) provided around the semiconductor layer 11. The device isolation layer is formed, for example, of an i-type GaN layer, a silicon oxide layer, or a silicon nitride layer. The light emitting sections 30 are formed in the form of islands in a patterning process using etching. That is, the blue light emitting sections 30B and the red light emitting sections 30R are electrically isolated from each other.

The blue light emitting sections 30B each include a plurality of nanocolumns (first columnar section) 31 and a light propagation layer 36. The nanocolumns 31 are each a columnar crystal structure that protrudes and extends upward from the semiconductor layer 11. The nanocolumns 31 each have, for example, a polygonal, circular, or elliptical planar shape. In the present embodiment, the nanocolumns 31 each have a circular planar shape, as shown in FIG. 2. The nanocolumns 31 have a diameter in the order of nanometers, for example, greater than or equal to 10 nm but smaller than or equal to 500 nm. The dimension of the nanocolumns 31 in the lamination direction, what is called a height of the nanocolumns 31, is, for example, greater than or equal to 0.1 μm but smaller than or equal to 5 μm.

In a case where the nanocolumns 31 each have a circular planar shape, the term "the diameter of the nanocolumns 31" refers to the diameter of the circular shape, and when the nanocolumns 31 each have a non-circular planar shape, the term refers to the diameter of the minimum circle containing the non-circular shape therein. For example, when the nanocolumns 31 each have a polygonal planar shape, the diameter of the nanocolumns 31 is the diameter of the minimum circle containing the polygonal shape therein, and when the nanocolumns 31 each have an elliptical planar shape, the diameter of the nanocolumns 31 is the diameter of the minimum circle containing the elliptical shape therein.

In the case where the nanocolumns 31 each have a circular planar shape, the term "the center of each of the nanocolumns 31" refers to the center of the circular shape, and when the nanocolumns 31 each have a non-circular planar shape, the term refers to the center of the minimum circle containing the non-circular shape therein. For example, when the nanocolumns 31 each have a polygonal planar shape, the center of each of the nanocolumns 31 is the center of the minimum circle containing the polygonal shape therein, and when the nanocolumns 31 each have an elliptical planar shape, the center of each of the nanocolumns 31 is the center of the minimum circle containing the elliptical shape therein.

The plurality of columnar sections 31 are arranged in a predetermined direction at predetermined intervals in the plan view. The nanocolumns 31 can provide a photonic crystal effect and each trap the light emitted by the light emitting layer in the in-plane direction of the base 10 and output the light in the lamination direction. The "lamination direction" is the direction along the direction of a normal to a surface of the base 10 that is the surface on which the laminate is provided, that is, the substrate surface. The "in-plane direction of the base 10" is the direction along a plane perpendicular to the lamination direction.

The nanocolumns 31 each have a first semiconductor layer 32, the light emitting layer (first light emitting layer) 33, and a second semiconductor layer 34, as shown in FIG. 3. The layers that form each of the nanocolumns 31 are formed by epitaxial growth, as will be described later.

The first semiconductor layer 32 is provided on the semiconductor layer 11. The first semiconductor layer 32 is provided between the base 10 and the light emitting layer 33. The first semiconductor layer 32 is formed, for example, of an n-type GaN layer to which Si has been doped. In the present embodiment, the first semiconductor layer 32 is made of the same material as that of the semiconductor layer 11.

The light emitting layer 33 is provided on the first semiconductor layer 32. The light emitting layer 33 is provided between the first semiconductor layer 32 and the second semiconductor layer 34. The light emitting layer 33 has, for example, a quantum well structure formed of a GaN layer and an InGaN layer. The light emitting layer 33 emits light when electric current is injected thereinto via the first semiconductor layer 32 and the second semiconductor layer 34. The numbers of GaN layers and InGaN layers that form the light emitting layer 33 are each not limited to a specific number.

In the present embodiment, the light emitting layer emits, for example, blue light that belongs to a blue wavelength band from 430 to 470 nm.

The second semiconductor layer 34 is provided on the light emitting layer 33. The second semiconductor layer 34 differs from the first semiconductor layer 32 in terms of conductivity type. The second semiconductor layer 34 is formed, for example, of a p-type GaN layer to which Mg has been doped. The first semiconductor layer 32 and the second semiconductor layer 34 function as a cladding layer having the function of confining the light within the light emitting layer 33.

The light propagation layer 36 is provided so as to surround each of the nanocolumns 31 in the plan view. The refractive index of the light propagation layer 36 is smaller than the refractive index of the light emitting layer 33. The light propagation layer 36 is, for example, a GaN layer or a titanium oxide ($TiO_2$) layer. The GaN layer, which forms the light propagation layer 36, can be of i-type, n-type, or p-type. The light propagation layer 36 allows the light generated in the light emitting layer 33 to propagate in the in-plane direction.

In the blue light emitting section 30B, the laminate of the p-type second semiconductor layer 34, the light emitting layer 33, to which no impurity has been doped, and the n-type first semiconductor layer 32 forms a pin diode. The bandgap of each of the first semiconductor layer 32 and the second semiconductor layer 34 is wider than the bandgap of the light emitting layer 33. In the blue light emitting section 30B, when the forward bias voltage for the pin diode is applied to the space between the lower-layer electrode 60B and the upper-layer electrode 70B so that current is injected into the pin diode, electrons and holes recombine with each other in the light emitting layer 33. The recombination causes light emission.

The first semiconductor layer 32 and the second semiconductor layer 34 cause the light generated in the light emitting layer 33 to propagate through the light propagation layer 36 in the in-plane direction of the base 10. In this process, the photonic crystal effect provided by the nanocolumns 31 causes the light to form a standing wave, which is confined in the in-plane direction of the base 10. The confined light receives gain in the light emitting layer 33 and undergoes laser oscillation. That is, the nanocolumns 31 cause the light generated in the light emitting layer 33 to resonate in the in-plane direction of the base 10, resulting in laser oscillation. Specifically, the light generated in the light emitting layer 33 resonates in the in-plane direction of the base 10 in a resonant section formed by the plurality of nanocolumns 31, resulting in laser oscillation. The positive first-order diffracted light and the negative first-order diffracted light generated by the resonance then travel as laser light in the lamination direction (axis-Z direction).

In the light emitting device 20, the refractive indices and thicknesses of the first semiconductor layers 32, the second semiconductor layers 34, and the light emitting layers 33 are so designed that the intensity of the light propagating in the in-plane direction is maximized in the light emitting layers 33 in the axis-Z direction.

In the present embodiment, out of the laser light that travels in the lamination direction, the laser light that travels toward the base 10 is reflected off a reflection layer (not shown) formed on the surface of the base 10 and travels upward. The blue light emitting sections 30B can thus emit the light via the upper side.

An insulating layer 35 is provided on the semiconductor layer 11 as shown in FIG. 3. The insulating layer 35 is provided between the light propagation layer 36 and the semiconductor layer 11. The insulating layer 35 functions as a mask for growing the films that form the nanocolumns 31 in the step of manufacturing the blue light emitting sections 30B. The insulating layer 35 is formed, for example, of a silicon oxide layer or a silicon nitride layer.

The first protective layer 51 is provided on the base 10 (semiconductor layer 11) so as to cover the blue light emitting sections 30B. The first protective layer 51 is, for example, a silicon oxide layer. The first protective layer 51 has the function of planarizing the upper surface of the base 10 and protecting the blue light emitting sections 30B from impact and other external influences. The first protective layer 51 has contact holes (first through hole) 151, which expose the upper side of the blue light emitting sections 30B.

The lower-layer electrode 60B is provided on the semiconductor layer 11 on the side facing the blue light emitting sections 30B. The lower-layer electrode 60B is electrically coupled to the first semiconductor layers 32 of the nanocolumns 31 via the semiconductor layer 11. The lower-layer electrode 60B is one of the electrodes for injecting the current into the light emitting layers 33. The lower-layer electrode 60B is formed, for example, of a metal layer made, for example, of Ni, Ti, Cr, Pt, or Au or a laminated metal film formed of layers made of the elements described above.

The upper-layer electrode 70B is provided on the blue light emitting sections 30B. The upper-layer electrode 70B is the other one of the electrodes for injecting the current into the light emitting layers 33 of the nanocolumns 31. The upper-layer electrode 70B is provided so as to be in contact with part of the nanocolumns 31 and the light propagation layer 36. The upper-layer electrode 70B is formed of a plurality of upper-layer electrodes 70B in accordance with the number of blue light emitting sections 30B. Part of each of the upper-layer electrodes 70B is exposed in the contact hole 151 provided in the first protective layer 51.

The upper-layer electrodes 70B are each formed, for example, of a metal layer made, for example, of Ni, Ti, Cr, Pt, or Au or a laminated metal film formed of layers made of some of the elements described above. The upper-layer electrodes 70B are electrodes for improving the conductivity between the drawn electrode 71B and the blue light emitting sections 30B. The upper-layer electrodes 70B are each a thin film having a thickness of about several tens of nanometers and therefore transmit light.

The drawn electrode 71B is coupled to the upper-layer electrodes 70B, which are exposed in the contact holes 151. The drawn electrode 71B is drawn over the first protective layer 51 via the contact holes 151.

The drawn electrode 71B is a light transmissive, electrically conductive layer formed, for example, of an ITO (indium tin oxide) layer or an IZO (indium zinc oxide) layer. The light generated in the light emitting layers 33 passes through the upper-layer electrodes 70B and the drawn electrode 71B and exits upward.

The first wiring 81 is laminated on the drawn electrode 71B. The first wiring 81 is electrically coupled to the second semiconductor layers 34 in the nanocolumns 31 in the blue light emitting sections 30B via the drawn electrode 71B and the upper-layer electrodes 70B. The first wiring 81 is formed, for example, of a metal layer made, for example, of Ni, Ti, Cr, Pt, or Au or a laminated metal film formed of layers made of some of the elements described above.

The first wiring 81 is coupled, for example, via wires to a drive circuit provided on the base 10 in a region that is not shown. The lower-layer electrode 60B described above is coupled, for example, via wires to the drive circuit provided on the base 10 in the region that is not shown. Based on the configuration described above, the light emitting apparatus 12 injects current into the light emitting layers via the lower-layer electrode 60B and the upper-layer electrodes 70B by driving the drive circuit, and the blue light emitting sections 30B can thus emit light.

On the other hand, the red light emitting sections 30R each include a plurality of nanocolumns (second columnar section) 41 and a light propagation layer 46. The red light emitting sections 30R each have the same configuration as that of each of the blue light emitting sections 30B except that the color of the light emitted by the red light emitting section 30R differs from the color of the light emitted by the blue light emitting section 30B. The same configurations of each of the red light emitting sections 30R as those of each of the blue light emitting section 30B will not therefore be described below.

The nanocolumns 41 each include a light emitting layer (second light emitting layer) 43, which emits red light, as shown in FIG. 3.

The second protective layer 52 is provided on the base 10 (semiconductor layer 11) so as to cover the red light emitting sections 30R. The second protective layer 52 is made of the same material as that of the first protective layer 51. The second protective layer 52 has the function of planarizing the upper surface of the base 10 and protecting the red light emitting sections 30R from impact and other external influences. The second protective layer 52 has contact holes (second through hole) 152, which expose the upper side of the red light emitting sections 30R.

The lower-layer electrode 60R is provided on the semiconductor layer 11 on the side facing the red light emitting sections 30R. The lower-layer electrode 60R is one of the electrodes for injecting current into light emitting layers 43 of the nanocolumns 41. The upper-layer electrode 70R is provided on the red light emitting sections 30R. The upper-layer electrode 70R is the other one of the electrodes for injecting the current into the light emitting layers 43 of the nanocolumns 41. The upper-layer electrode 70R is provided so as to be in contact with part of the nanocolumns and the light propagation layer 46. The upper-layer electrode 70R is formed of a plurality of upper-layer electrodes 70R in accordance with the number of red light emitting sections 30R. Part of each of the upper-layer electrodes 70R is exposed in the contact hole 152 provided in the second protective layer 52.

The drawn electrode 71R is coupled to the upper-layer electrodes 70R, which are exposed in the contact holes 152. The drawn electrode 71R is drawn over the second protective layer 52 via the contact holes 152.

The second wiring 82 is laminated on the drawn electrode 71R. The second wiring 82 is electrically coupled to the nanocolumns 41 in the red light emitting sections 30R via the drawn electrode 71R and the upper-layer electrodes 70R.

The second wiring 82 is coupled, for example, via wires, to a drive circuit provided on the base 10 in a region that is not shown. The lower-layer electrode 60R described above is coupled, for example, via wires, to the drive circuit on the base 10 in the region that is not shown. Based on the configuration described above, the light emitting device 20 injects current into the light emitting layers 43 via the lower-layer electrode 60R and the upper-layer electrodes 70R by driving the drive circuit, and the red light emitting sections 30R can thus emit light.

In the light emitting apparatus 12 according to the present embodiment, the light emitting area of each of the blue light emitting sections 30B is configured to be greater than that of each of the red light emitting sections 30R in the light emitting device 20, as described above. The size of the light emitting area is defined by the area where the nanocolumns are in contact with the electrodes, that is, the size of the electrodes formed on the nanocolumns. That is, in the present embodiment, the area of the upper-layer electrode 70B formed on the nanocolumns 31 in each of the blue light emitting sections 30B is greater than the area of the upper-layer electrode 70R formed on the nanocolumns 41 in each of the red light emitting sections 30R. The diameter of the opening of the contact holes 151, which expose the upper-layer electrodes 70B, is therefore greater than the diameter of the opening of the contact holes 152, which expose the upper-layer electrodes 70R.

The contact holes 151 each include an upper hole (first hole) 1511 and a lower hole (second hole) 1512, as shown in FIG. 3. The lower hole 1512 is located in a position shifted from the upper hole 1511 toward the base 10 (lower side), and the upper hole 1511 is located above the lower hole 1512 (on the side opposite from base 10).

In the present embodiment, the contact holes 151 are formed in an etching step, as will be described later. The contact holes 151, specifically, the upper holes 1511 and the lower holes 1512 are formed in a two-stage etching step. The etching conditions under which the upper holes 1511 are formed in the first protective layer 51 differ from the etching conditions under which the lower holes 1512 are formed in the first protective layer 51. The step of etching the contact holes 151 will be described later.

In the present embodiment, the upper holes 1511 are each so tapered that the inner diameter thereof narrows downward. The upper hole 1511 is therefore so shaped that a first opening 1511a, which is the upper-end opening and is located in a position farthest (uppermost) from the base 10, has a first opening area S1, which is the largest area, and a fifth opening 1511b, which is the lower-end opening and is located in a position closest to the base 10, has a fifth opening area S5, which is the smallest area.

The lower holes 1512 are each formed in part of a bottom surface 1513 of the upper hole 1511. The lower hole 1512 exposes part of the upper-layer electrode 70B. The bottom surface 1513 of the upper hole 1511 is a flat surface. Since the upper hole 1511 is formed in an etching step, as will be described later, the state in which the bottom surface 1513 is a flat surface means that the bottom surface is not a flat surface with no irregularities, such as a mirror surface, but is a surface having minute irregularities that can be typically produced in an etching step.

In the present embodiment, the lower hole 1512 is so tapered that the inner diameter thereof narrows downward. The lower hole 1512 is therefore so shaped that the upper-end opening, which is located in a position farthest (uppermost) from the base 10, has a largest opening area and a second opening 1512a, which is the lower-end opening and is located in a position closest to the base 10, has a second opening area S2, which is the smallest area. The opening area of the upper-end opening of the lower hole 1512 is smaller than the fifth opening area S5 of the upper hole 1511.

In the present embodiment, the first opening area S1 of the upper hole 1511 is greater than the second opening area S2 of the lower hole 1512.

In the present embodiment, the thickness of the first protective layer 51, which covers the upper-layer electrodes 70B, is set at a value ranging, for example, from 600 to 1000 nm.

The upper hole 1511 is so formed that the thickness of a portion of the first protective layer 51 that is the portion (bottom surface 1513) that covers the upper-layer electrode 70B is about ¼ to ⅙ of the thickness of the first protective layer 51. It is desirable to ensure that the portion that covers the upper-layer electrode 70B has a thickness of 150 nm or greater in consideration of current leakage and other factors.

For example, when the first protective layer 51 that covers the upper-layer electrode 70B has a thickness of 600 nm, the depth of the upper hole 1511 may be set at 450 nm to allow the first protective layer 51 having the film thickness of 150 nm to cover the upper-layer electrode 70B. When the first protective layer 51 that covers the upper-layer electrode 70B has a thickness of 1000 nm, the depth of the upper hole 1511 may be set at 850 nm to allow the first protective layer 51 having the film thickness of 150 nm to cover the upper-layer electrode 70B.

The contact holes 152 each include an upper hole (third hole) 1521 and a lower hole (fourth hole) 1522, as shown in FIG. 3. The lower hole 1522 is located in a position shifted from the upper hole 1521 toward the base 10 (lower side), and the upper hole 1521 is located above the lower hole 1522.

In the present embodiment, the contact holes 152 are formed in an etching step, as will be described later. The contact holes 152, specifically, the upper holes 1521 and the lower holes 1522 are formed in a two-stage etching step. That is, the etching conditions under which the upper holes 1521 are formed in the second protective layer 52 differ from the etching conditions under which the lower holes 1522 are formed in the second protective layer 52. The upper holes 1521 are formed in the same etching step as the etching step in which the upper holes 1511 of the contact holes 151 are formed. The lower holes 1522 are formed in the same etching step as the etching step in which the lower holes 1512 of the contact holes 151 are formed. The step of etching the contact holes 152 will be described later.

In the present embodiment, the upper holes 1521 are each so tapered that the inner diameter thereof narrows downward. The upper hole 1521 is therefore so shaped that a third opening 1521a, which is the upper-end opening and is located in a position farthest (uppermost) from the base 10, has a third opening area S3, which is the largest area, and a sixth opening 1521b, which is the lower-end opening and is located in a position closest to the base 10, has a sixth opening area S6, which is the smallest area.

The lower holes 1522 are each formed in part of a bottom surface 1523 of the upper hole 1521. The lower hole 1522 exposes part of the upper-layer electrode 70R. The bottom surface 1523 of the upper hole 1521 is a flat surface. The state in which the bottom surface 1523 is a flat surface means that the bottom surface is a surface having minute irregularities that can be typically produced in an etching step.

In the present embodiment, the lower hole 1522 is so tapered that the inner diameter thereof narrows downward. The lower hole 1522 is therefore so shaped that an upper-end opening that is located in a position farthest (uppermost) from the base 10 has a largest opening area and a fourth opening 1522a, which is the lower-end opening and is located in a position closest to the base 10, has a fourth opening area S4, which is the smallest area. The opening area of the upper-end opening of the lower hole 1522 is smaller than the sixth opening area S6 of the upper hole 1521.

In the present embodiment, the third opening area S3 of the upper hole 1521 is greater than the fourth opening area S4 of the lower hole 1522.

In the present embodiment, the first opening area S1 of the upper hole 1511 of each of the contact holes 151 is equal to the third opening area S3 of the upper hole 1521 of each of the contact holes 152. The fifth opening area S5 of the upper hole 1511 of each of the contact holes 151 is equal to the sixth opening area S6 of the upper hole 1521 of each of the contact holes 152.

As described above, in the present embodiment, the upper holes 1511 of the contact holes 151 and the upper holes 1521 of the contact holes 152 have the same opening shape. The upper holes 1511 and the upper holes 1521 are holes having been etched at the same etching rate.

On the other hand, in the present embodiment, the lower holes 1512 of the contact holes 151 and the lower holes 1522 of the contact holes 152 have different opening shapes. The lower holes 1512 and the lower holes 1522 are holes having been etched at different etching rates.

In the present embodiment, the second opening area S2 of the lower holes 1512 of the contact holes 151 is greater than the fourth opening area S4 of the lower holes 1522 of the contact holes 152. The contact holes 151 can thus expose the upper-layer electrodes 70B, which each have an area larger than that of each of the upper-layer electrodes 70R.

A first area ratio is now defined as the ratio between the first opening area S1 of the upper hole 1511 of each of the contact holes 151 and the third opening area S3 of the upper hole 1521 of each of the contact holes 152. A second area ratio is defined as the ratio between the second opening area S2 of the lower hole 1512 of each of the contact holes 151 and the fourth opening area S4 of the lower hole 1522 of each of the contact holes 152.

Since the upper holes 1511 and 1521 have the same opening shape as described above, the first area ratio is about 1. Since the second opening area S2 is greater than the fourth opening area S4 as described above, the second area ratio is smaller than 1. For example, when the second opening area S2 is twice as large as the fourth opening area S4, the second area ratio is 0.5.

As described above, in the light emitting apparatus 12 according to the present embodiment, the first area ratio, which is the ratio between the first opening area S1 and the third opening area S3, is smaller than the second area ratio, which is the ratio between the second opening area S2 and the fourth opening area S4.

The contact holes 151 are formed in positions where the contact holes 151 expose part of the upper-layer electrodes 70B in the plan view viewed in the direction of a normal to the substrate that forms the base 10. That is, the contact holes 151 are each so formed that an outer edge 512 of the second opening 1512*a* of the lower hole 1512 of the contact hole 151 overlaps with the upper-layer electrode 70B in the plan view viewed in the direction of a normal to the base 10. The outer edge 512 of the second opening 1512*a* may at least partially overlap with the upper-layer electrode 70B.

The contact holes 152 are formed in positions where the contact holes 152 expose part of the upper-layer electrodes 70R in the plan view viewed in the direction of a normal to the substrate that forms the base 10. That is, the contact holes 152 are each so formed that an outer edge 522 of the fourth opening 1522*a* of the lower hole 1522 of the contact hole 152 overlaps with the upper-layer electrode 70R in the plan view viewed in the direction of a normal to the base 10. The outer edge 522 of the fourth opening 1522*a* may at least partially overlap with the upper-layer electrode 70R.

A method for manufacturing the light emitting apparatus 12 according to the present embodiment will be subsequently described.

FIGS. 4A to 4E show key parts in the steps of manufacturing the light emitting apparatus 12. The following description will be primarily made of the steps of manufacturing the blue light emitting sections 30B and the red light emitting sections 30R.

Figure 4A:
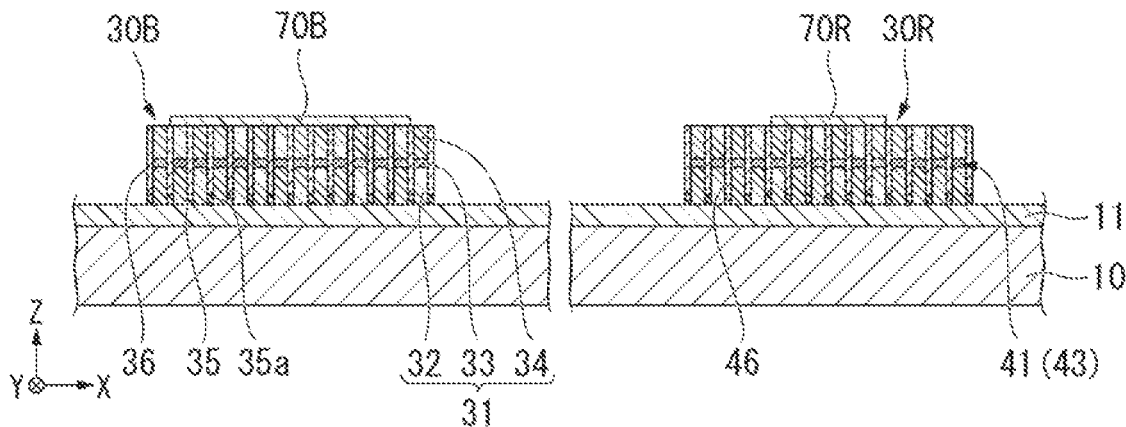
FIG. 4A shows key parts in one of the steps of manufacturing a light emitting apparatus.

First, the step of forming the light emitting sections 30, which each include the blue light emitting section 30B and the red light emitting section 30R, in the form of islands on the base 10 is carried out, as shown in FIG. 4A.

In the step of forming the light emitting sections 30, the semiconductor layer 11 is first epitaxially grown in a predetermined region on the base 10. Examples of the epitaxial growth method may include the MOCVD (metal organic chemical vapor deposition) method and the MBE (molecular beam epitaxy) method.

First, a plurality of nanocolumns 31 are formed on the semiconductor layer 11, and the optical propagation layer 36 is formed around each of the nanocolumns 31.

Specifically, to form the nanocolumns 31, the insulating layer 35 is formed on the semiconductor layer 11. The insulating layer 35 is formed, for example, by deposition using the CVD (chemical vapor deposition) or the sputtering method and patterning using photolithography and etching (hereinafter also simply referred to as "patterning"). The insulating layer 35 with openings formed therein can be used as a mask to form the nanocolumns 31 by epitaxially growing the first semiconductor layers 32, the light emitting layers 33, and the second semiconductor layers 34 in this order on the semiconductor layer 11, for example, by using the MOCVD method or the MBE method.

The light propagation layer 36 is formed around each of the nanocolumns 31 after the nanocolumns 31 are formed. The light propagation layer 36 is formed, for example, by using an ELO (epitaxial lateral overgrowth) method using the MOCVD or MBE method.

Thereafter, unnecessary nanocolumns 31 and light propagation layer 36 formed in the region excluding the regions where the blue light emitting sections 30B are to be formed are removed, for example, in a dry etching process using a Cl-based etching gas. The blue light emitting sections 30B are thus formed on the semiconductor layer 11.

The upper-layer electrodes 70B are then formed on the blue light emitting sections 30B. The blue light emitting sections 30B are formed, for example, by film formation using sputtering or vacuum evaporation, and patterning.

To form the red light emitting sections 30R, a plurality of nanocolumns 41 are formed on the semiconductor layer 11, and the light propagation layer 46 is formed around each of the nanocolumns 41, followed by dry-etching-based removal of unnecessary nanocolumns 41 and light propagation layer 46 formed in the region excluding the regions where the red light emitting sections 30R are to be formed, as in the formation of the blue light emitting sections 30B. The red light emitting sections 30R are thus formed on the semiconductor layer 11. The upper-layer electrodes 70R are then formed on the red light emitting sections 30R. In the present embodiment, the area of each of the upper-layer electrodes 70R is smaller than the area of each of the upper-layer electrodes 70B.

Figure 4B:
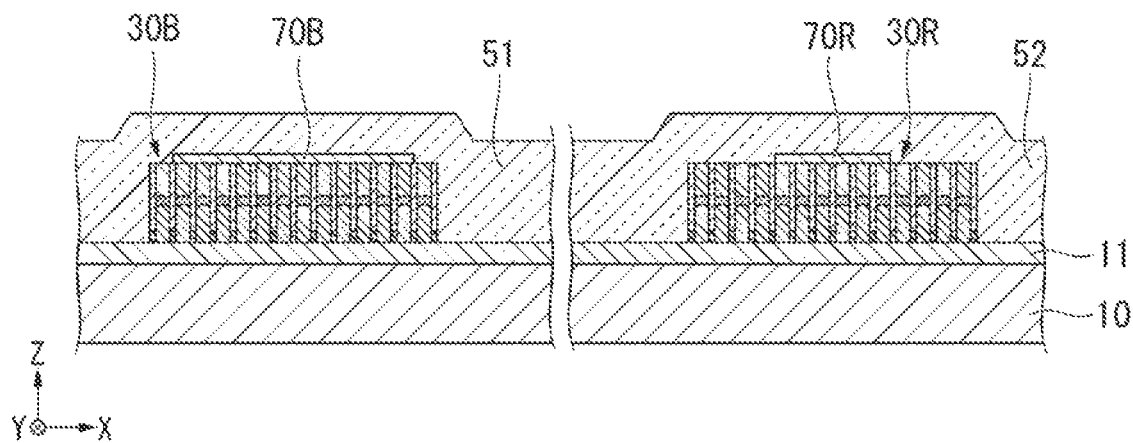
FIG. 4B shows key parts in one of the steps of manufacturing the light emitting apparatus.

Subsequently, the first protective layer 51 is formed on the base 10 so as to cover the blue light emitting sections 30B and the upper-layer electrode 70B, as shown in FIG. 4B. The second protective layer 52 is formed on the base 10 so as to cover the red light emitting sections 30R and the upper-layer electrodes 70R. The first protective layer 51 and the second protective layer 52 are formed, for example, by film formation using spin coating. The first protective layer 51 and the second protective layer 52 are therefore made of the same material.

Subsequently, the contact holes 151 and 152 are formed in the first protective layer 51 and the second protective layer 52, respectively. Although not shown in the figures, the first protective layer 51 and the second protective layer 52 are each patterned into a predetermined shape before the formation of the contact holes 151 and 152.

Figure 4C:
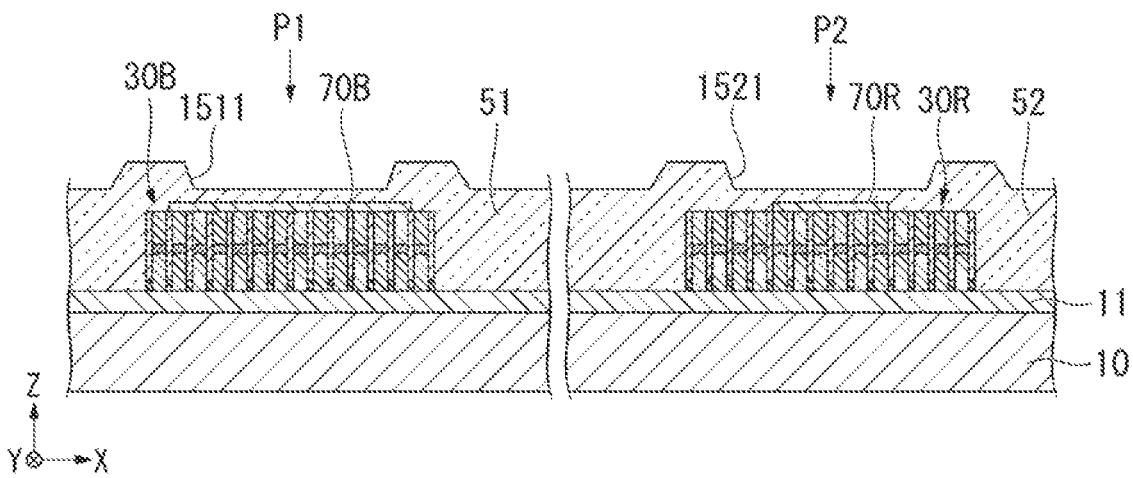
FIG. 4C shows key parts in one of the steps of manufacturing the light emitting apparatus.

Specifically, the upper holes 1511 as the first hole are formed in first positions P1 in the first protective layer 51, where the upper holes 1511 overlap with the upper-layer electrodes 70B, as shown in FIG. 4C. In the present embodiment, in the formation of the upper holes 1511 in the first protective layer 51, the upper holes (first hole) 1521 are simultaneously formed in second positions P2 in the second protective layer 52, where the upper holes 1521 overlap with the upper-layer electrodes 70R. Since the upper holes 1511 and 1521 have the same opening shape, the upper holes 1511 and 1521 are formed under the same etching conditions.

Figure 4D:
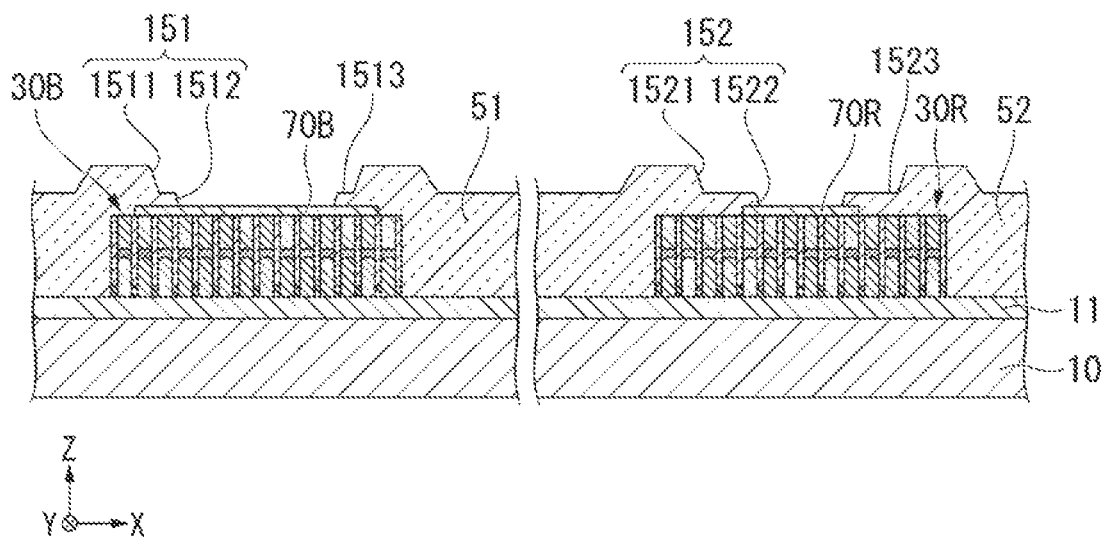
FIG. 4D shows key parts in one of the steps of manufacturing the light emitting apparatus.

Subsequently, the lower holes 1512 as the second hole each having an opening area smaller than the opening area of each of the upper holes 1511 are formed in the bottom surfaces 1513 of the upper holes 1511 formed in the first positions P1, so that the contact holes 151, which expose part of the upper-layer electrodes 70B, are formed, as shown in FIG. 4D. The lower holes 1522 as the third hole each having an opening area smaller than the opening area of each of the lower holes 1512 are formed in the bottom surfaces 1523 of the upper holes 1521 formed in the second positions P2, so that the contact holes 152, which expose part of the upper-layer electrodes 70R, are formed.

In general, it is difficult to use the same etching rate to form holes having different opening areas. For example, the step of etching a hole having a large opening area uses a large amount of etching gas, so that the etching period is shorter than that for a hole having a small opening area. Therefore, to etch large-diameter and small-diameter holes at the same time, the etching period set at a value suitable for the large-diameter hole, the etching of which relatively readily progresses, is not long enough for the small-diameter hole, the etching of which does not relatively readily progress, so that the small-diameter hole is not etched sufficiently, resulting in a problem of poor conductivity and other problems due to adhesion of etching residues.

On the other hand, when the etching period is set at a value suitable for the small-diameter hole, the etching of which does not relatively readily progress, the etching period for which the large-diameter hole is etched increases, so that the electrode exposed through the large-diameter hole is exposed to the plasma for a long period, resulting in a problem of degradation of the characteristics of the final product due to the etching damage.

In contrast, in the present embodiment, forming the upper holes 1511 and 1521 in the first protective layer 51 and the second protective layer 52 in advance reduces the thickness of the first protective layer 51 that covers the upper-layer electrodes 70B and the thickness of the second protective layer 52 that covers the upper-layer electrodes 70R. The thicknesses of the layers to be etched to form the lower holes 1512 and 1522 can thus be reduced by the depths of the upper holes 1511 and 1521 as compared with a case where the lower holes 1512 and 1522 are formed directly in the first protective layer 51 and the second protective layer 52 without formation of the upper holes 1511 and 1512. Therefore, even when the contact holes 151 and 152 having different opening diameters are formed in the first protective layer 51 and the second protective layer 52, occurrence of problems, such as degradation of the characteristics of the final product due to etching residues and etching damage caused by a difference in etching rate can be suppressed.

Figure 4E:
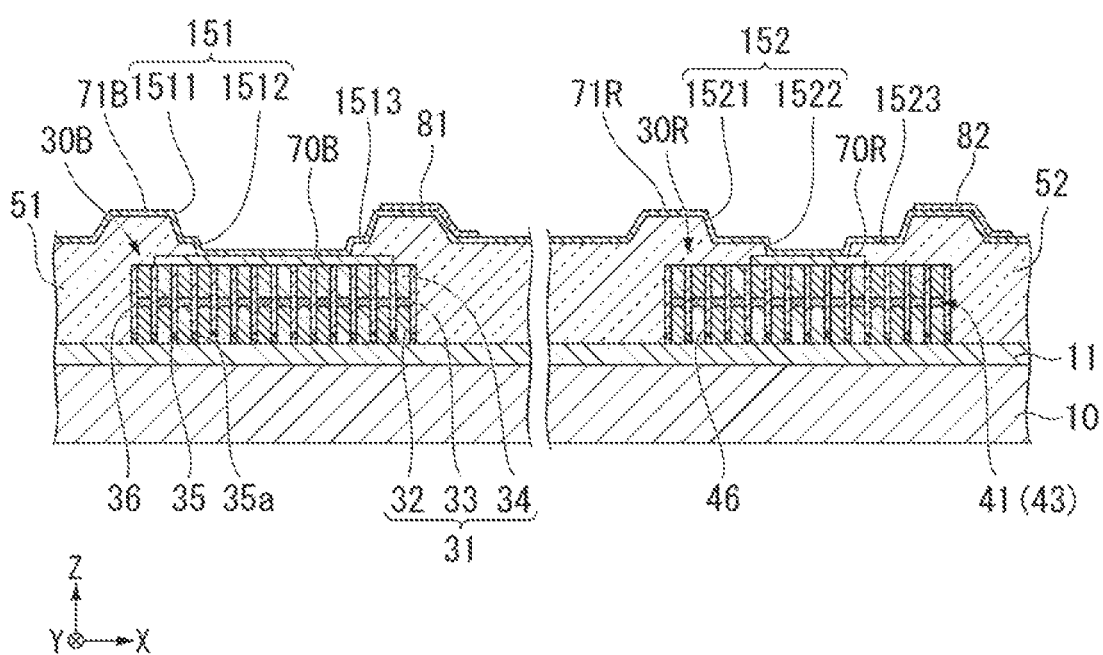
FIG. 4E shows key parts in one of the steps of manufacturing the light emitting apparatus.

Subsequently, the drawn electrode 71B is formed on the upper-layer electrodes 70B exposed in the contact holes 151, and the drawn electrode 71R is formed on the upper-layer electrodes 70R exposed in the contact holes 152, as shown in FIG. 4E. The drawn electrodes 71B and 71R are formed, for example, by film formation using sputtering or vacuum evaporation, and patterning. Subsequently, the first wiring 81 and the second wiring 82 are formed on the drawn electrodes 71B and 71R, respectively. The first wiring 81 and the second wiring 82 are formed, for example, by film formation using sputtering or vacuum evaporation, and patterning.

The lower-layer electrodes 60B and 60R (see FIG. 3) are then formed in regions that are not shown and differ from the regions where the light emitting sections 30 are formed. The lower-layer electrodes 60B and 60R are formed, for example, by film formation using sputtering or vacuum evaporation, and patterning. The step of forming the lower-layer electrodes 60B and 60R and the step of forming the drawn electrodes 71B and 71R and the first wiring 81 and the second wiring 82 are not necessarily carried out in a specific order.

Finally, the drive circuits are mounted on the base 10, for example, by using bonding members (not shown), and the drive circuits are electrically coupled to the lower-layer electrodes 60B and 60R, the first wiring 81, and the second wiring 82 of the light emitting sections 30, for example, with wires. The heat sink 21 is then attached to the lower surface (surface facing side −Z) of the base 10. The light emitting apparatus 12 according to the present embodiment is thus manufactured.

Effects of Present Embodiment

As described above, the light emitting apparatus 12 according to the present embodiment includes the base 10, the blue light emitting sections 30B provided on the base 10, the red light emitting sections 30R provided on the base 10, the upper-layer electrodes 70B provided on one side of the blue light emitting sections 30B that is the side opposite from the base 10, the upper-layer electrodes 70R provided on one side of the red light emitting sections 30R that is the side opposite from the base 10, the first protective layer 51, which covers the blue light emitting sections 30B and the upper-layer electrodes 70B, and the second protective layer 52, which covers the red light emitting sections 30R and the upper-layer electrodes 70R. The area of each of the upper-layer electrodes 70B is greater than the area of each of the upper-layer electrodes 70R. The first protective layer 51 has the contact holes 151, which expose part of the upper-layer electrodes 70B. The second protective layer 52 has the contact holes 152, which expose part of the upper-layer electrodes 70R. The contact holes 151 each have the upper hole 1511 and the lower hole 1512, which is located in a position shifted from the upper hole 1511 toward the base 10. The contact holes 152 each have the upper hole 1521 and the lower hole 1522, which is located in a position shifted from the upper hole 1521 toward the base 10. The first opening area S1 of an opening of the upper hole 1511 that is the opening farthest from the base 10 is greater than the second opening area S2 of an opening of the lower hole 1512 that is the opening closest to the base 10. The third opening area S3 of an opening of the upper hole 1521 that is the opening farthest from the base 10 is greater than the fourth opening area S4 of an opening of the lower hole 1522 that is the opening closest to the base 10. The second opening area S2 is greater than the fourth opening area S4.

In the light emitting apparatus 12 according to the present embodiment, part of the upper-layer electrodes 70B is exposed through the contact holes 151 each having the upper hole 1511 and the lower hole 1512, and part of the upper-layer electrodes 70R is exposed through the contact holes 152 each having the upper hole 1521 and the lower hole 1522. Forming the upper holes 1511 and 1521 in the first protective layer 51 and the second protective layer 52 therefore reduces the thickness of the first protective layer 51 that covers the upper-layer electrodes 70B, and the thickness of the second protective layer 52 that covers the upper-layer electrodes 70R. The thicknesses of the layers to be etched to form the lower holes 1512 and 1522 having different diameters can thus be reduced as compared with the configuration in which the lower holes 1512 and 1522 are formed directly in the first protective layer 51 and the second protective layer 52.

Therefore, when the contact holes 151 and 152 having different opening diameters are formed in the first protective layer 51 and the second protective layer 52, degradation of the characteristics of the final product due to etching residues and etching damage caused by a difference in etching rate can be suppressed. The light emitting apparatus 12 according to the present embodiment is therefore highly reliable with the degree of the problem caused by a difference in etching rate lowered.

In the light emitting apparatus 12 according to the present embodiment, the first area ratio, which is the ratio between the first opening area S1 and the third opening area S3, is smaller than the second area ratio, which is the ratio between the second opening area S2 and the fourth opening area S4.

According to the configuration described above, the upper hole 1511 of each of the contact holes 151 and the upper hole 1521 of each of the contact holes 152 can be brought closer to each other in terms of the opening shape. The steps of etching the upper holes 1511 and 1521 can thus be carried out in a single step, whereby the upper holes 1511 and 1521 are readily manufactured.

In the light emitting apparatus 12 according to the present embodiment, the first opening area S1 is equal to the third opening area S3, and the fifth opening area S5, which is the area of an opening of the upper hole 1511 that is the opening closest to the base 10, is equal to the sixth opening area S6, which is the area of an opening of the upper hole 1521 that is the opening closest to the base 10.

According to the configuration described above, the openings of the upper holes 1511 and 1521 have the same shape, whereby the contact holes are readily formed.

In the light emitting apparatus 12 according to the present embodiment, the lower holes 1512 are formed in part of the bottom surfaces 1513 of the upper holes 1511, and the lower holes 1522 are formed in part of the bottom surfaces 1523 of the upper holes 1521.

According to the configuration described above, after the formation of the upper holes 1511 and 1521 in a first etching step, the lower holes 1512 and 1522 can be formed in a second etching step. The contact holes 151 and 152 can thus be formed in the two-stage etching step, whereby the degree of the problem caused by a difference in etching rate can be lowered.

In the light emitting apparatus 12 according to the present embodiment, the bottom surface 1513 of each of the upper holes 1511 and the bottom surface 1523 of each of the upper holes 1521 are each a flat surface.

According to the configuration described above, the depths of the upper holes 1511 and 1521 are readily controlled, whereby the upper holes 1511 and 1521 are readily manufactured.

In the light emitting apparatus 12 according to the present embodiment, the blue light emitting sections 30B each include a plurality of nanocolumns 31 each including the light emitting layer 33, and the red light emitting sections 30R each include a plurality of nanocolumns 41 each including the light emitting layer 43.

In this case, the light emitting apparatus 12 having a structure including the plurality of nanocolumns 31 and 41 as the blue light emitting sections 30B and the red light emitting sections 30R can be provided.

The method for manufacturing the light emitting apparatus 12 according to the present embodiment includes forming the blue light emitting sections 30B and the red light emitting sections 30R on the base 10, forming the upper-layer electrodes 70B on one side of the blue light emitting sections 30B that is the side opposite from the base 10, forming the upper-layer electrodes 70R, which each have an area smaller than the area of each of the upper-layer electrodes 70B, on one side of the red light emitting sections 30R that is the side opposite from the base 10, forming the first protective layer 51 on the base 10 so as to cover the blue light emitting sections 30B and the upper-layer electrodes 70B, forming the second protective layer 52 on the base 10 so as to cover the red light emitting sections 30R and the upper-layer electrodes 70R, forming the upper holes 1511 in the first positions P1 in the first protective layer 51, where the upper holes 1511 overlap with the upper-layer electrodes 70B, and the upper holes 1521 in the second positions P2 in the second protective layer 52, where the upper holes 1521 overlap with the upper-layer electrodes 70R, forming the lower holes 1512 in the bottom surfaces 1513 of the upper holes 1511 formed in the first positions P1, the lower holes 1512 each having an opening area smaller than the opening area of each of the upper holes 1511, to form the contact holes 151, which expose part of the upper-layer electrodes 70B, and forming the lower holes 1522 in the bottom surfaces 1523 of the upper holes 1521 formed in the second positions P2, the lower holes 1522 each having an opening area smaller than the opening area of each of the lower holes 1512, to form the contact holes 152, which expose part of the upper-layer electrodes 70R.

The method for manufacturing the light emitting apparatus 12 according to the present embodiment, which forms the upper holes 1511 and 1521 in the first protective layer and the second protective layer 52 in advance, allows reduction in the thickness of the first protective layer 51 that covers the upper-layer electrodes 70B and the thickness of the second protective layer 52 that covers the upper-layer electrodes 70R. The thicknesses of the protective layers to be etched to form the lower holes 1512 and 1522, which have different diameters, can therefore be reduced by the depth of the upper holes 1511 and 1521.

The contact holes 151 and 152 having different opening diameters can therefore be formed in the first protective layer 51 and the second protective layer 52 with degradation of the characteristics of the final product and other problems due to etching residues and etching damage caused by a difference in etching rate suppressed. A light emitting apparatus 12 having excellent reliability can therefore be provided.

The projector 1 according to the present embodiment includes the light emitting apparatus 12.

According to the present embodiment, providing the light emitting apparatus 12, which can suppress the problem caused by the etching step, allows the projector 1 to excel in reliability and display bright, high-quality images.

The technical scope of the present disclosure is not limited to the embodiment described above, and a variety of changes can be made thereto to the extent that the changes do not depart from the substance of the present disclosure.

For example, the aforementioned embodiment has been described with reference to the case where the light emitting sections 30 are each formed of a plurality of nanocolumns by way of example, but the present disclosure is not limited thereto.

Figure 5:
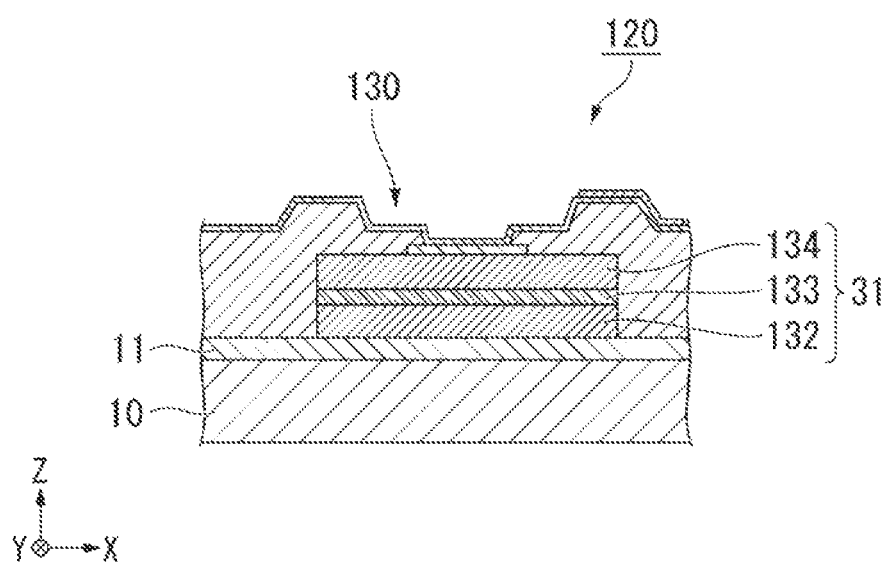
FIG. 5 is a cross-sectional view showing a configuration of a light emitting device according to a variation.

FIG. 5 is a cross-sectional view showing the configuration of a light emitting device 120 according to a variation. The light emitting device 120 according to the present variation has a configuration in which a light emitting section 130 is a laminate of film-shaped crystal structures, as shown in FIG. 5. The light emitting section 130 has a configuration in which a film-shaped first semiconductor layer 132, a film-shaped light emitting layer 133, and a film-shaped second semiconductor layer 134 are laminated on each other. In the configuration of the variation, a non-light-transmissive material is used as a protective layer that covers the light emitting section 130.

The aforementioned embodiment has been described with reference to the case where the light emitting layers are made of an InGaN-based material, and the light emitting layers can be made of any of a variety of other semiconductor materials in accordance with the wavelengths of the light to be outputted from the light emitting layers. Examples of the semiconductor material may include an AlGaN-based, AlGaAs-based, InGaAs-based, InGaAsP-based, InP-based, GaP-based, and AlGaP-based semiconductor materials. The diameter of the photonic crystal structures or the intervals at which the photonic crystal structures are arranged may be changed as appropriate in accordance with the wavelengths of the light to be outputted from the light emitting layers.

In addition to the above, the specific descriptions of the shape, the number, the arrangement, the material, and other factors of each component of the light emitting apparatus and the projector are not limited to those in the embodiment described above and can be changed as appropriate.

The aforementioned embodiment has been described with reference to the case where the light emitting apparatus according to the present disclosure is incorporated in a projector, but not necessarily. For example, the light emitting apparatus according to the present disclosure is applicable to a micro-LED display, a head mounted display, or a display apparatus of a smartwatch. The light emitting apparatus according to the present disclosure can be used in a lighting apparatus, a headlight of an automobile, and other products.

A light emitting apparatus according to an aspect of the present disclosure may have the configuration below.

The light emitting apparatus according to the aspect of the present disclosure includes a substrate, a first light emitting section provided on the substrate, a second light emitting section provided on the substrate, a first electrode provided on one side of the first light emitting section that is the side opposite from the substrate, a second electrode provided on one side of the second light emitting section that is the side opposite from the substrate, a first protective layer that covers the first light emitting section and the first electrode, and a second protective layer that covers the second light emitting section and the second electrode. The area of the first electrode is greater than the area of the second electrode in the plan view viewed in the direction of a normal to the substrate. The first protective layer has a first through hole. The second protective layer has a second through hole. The first through hole has a first hole and a second hole located in a position shifted from the first hole toward the substrate. The second through hole has a third hole and a fourth hole located in a position shifted from the third hole toward the substrate. A first opening area of a first opening of the first hole, which is the opening farthest from the substrate, is greater than a second opening area of a second opening of the second hole, which is the opening closest to the substrate. A third opening area of a third opening of the third hole, which is the opening farthest from the substrate, is greater than a fourth opening area of a fourth opening of the fourth hole, which is the opening closest to the substrate. In the plan view, the outer edge of the second opening overlaps with the first electrode, and the outer edge of the fourth opening overlaps with the second electrode. The second opening area is greater than the fourth opening area.

In the light emitting apparatus according to the aspect of the present disclosure, a first area ratio that is the ratio between the first opening area and the third opening area may be smaller than a second area ratio that is the ratio between the second opening area and the fourth opening area.

In the light emitting apparatus according to the aspect of the present disclosure, the first opening area may be equal to the third opening area, and a fifth opening area that is the area of a fifth opening of the first hole that is the opening closest to the substrate may be equal to a sixth opening area that is the area of a sixth opening of the third hole that is the opening closest to the substrate.

In the light emitting apparatus according to the aspect of the present disclosure, the second hole may be formed in part of the bottom surface of the first hole, and the fourth hole may be formed in part of the bottom surface of the third hole.

In the light emitting apparatus according to the aspect of the present disclosure, the bottom surface of the first hole and the bottom surface of the third hole may be each a flat surface.

In the light emitting apparatus according to the aspect of the present disclosure, the first light emitting section may include a plurality of first columnar sections each including a first light emitting layer, and the second light emitting section may include a plurality of second columnar sections each including a second light emitting layer.

A method for manufacturing the light emitting apparatus according to another aspect of the present disclosure may have the configurations below.

The method for manufacturing the light emitting apparatus according to the other aspect of the present disclosure includes forming a first light emitting section and a second light emitting section on a substrate, forming a first electrode on one side of the first light emitting section that is the side opposite from the substrate, forming a second electrode having an area smaller than the area of the first electrode on one side of the second light emitting section that is the side opposite from the substrate, forming a first protective layer on the substrate so as to cover the first light emitting section and the first electrode, forming a second protective layer on the substrate so as to cover the second light emitting section and the second electrode, forming a first hole in a first position in the first protective layer where the first hole overlaps with the first electrode and another first hole in a second position in the second protective layer where the other first hole overlaps with the second electrode in the plan view viewed in the direction of a normal to the substrate, forming a second hole in the bottom surface of the first hole formed in the first position, the second hole having an opening area smaller than the opening area of the first hole, to form a first through hole that exposes part of the first electrode, and forming a third hole in the bottom surface of the first hole formed in the second position, the third hole having an opening area smaller than the opening area of the second hole, to form a second through hole that exposes part of the second electrode.

In the method for manufacturing the light emitting apparatus according to the other aspect of the present disclosure, a plurality of first columnar sections each including a first light emitting layer may be formed as the first light emitting section, and a plurality of second columnar sections each including a second light emitting layer may be formed as the second light emitting section.

A projector according to another aspect of the present disclosure may have the configuration below.

The projector according to the other aspect of the present disclosure includes the light emitting apparatus according to the aspect of the present disclosure.

What is claimed is:

1. A light emitting apparatus comprising:
   a substrate;
   a first light emitting section provided on the substrate;
   a second light emitting section provided on the substrate;
   a first electrode provided at a first top of the first light emitting section;
   a second electrode provided at a second top of the second light emitting section;
   a first protective layer that covers the first light emitting section and the first electrode; and
   a second protective layer that covers the second light emitting section and the second electrode,
   wherein an area of the first electrode is greater than an area of the second electrode in a plan view,
   the first protective layer has a first through hole directly above the first light emitting section,
   the second protective layer has a second through hole directly above the second light emitting section,
   the first through hole has a first hole and a second hole therein, and the second hole is located at a position downwardly shifted from the first hole toward the first light emitting section,
   the second through hole has a third hole and a fourth hole therein, and the fourth hole is located at a position downwardly shifted from the third hole toward the second light emitting section,
   a first opening area of a first opening of the first hole is larger than a second opening area of a second opening of the second hole,
   a third opening area of a third opening of the third hole is larger than a fourth opening area of a fourth opening of the fourth hole,
   an outer edge of the second opening overlaps with the first electrode in the plan view, and an outer edge of the fourth opening overlaps with the second electrode in the plan view, and
   the second opening area is larger than the fourth opening area.

2. The light emitting apparatus according to claim 1, wherein a first area ratio that is a ratio between the first opening area and the third opening area is smaller than a second area ratio that is a ratio between the second opening area and the fourth opening area.

3. The light emitting apparatus according to claim 1, wherein the first opening area is equal to the third opening area,
   the first hole further has a fifth opening having a fifth opening area, and the fifth opening is located closer to the first light emitting section than the first opening,
   the third hole further has a sixth opening having a sixth opening area, and the sixth opening is located closer to the second light emitting section than the third opening, and
   the fifth opening area is equal to the sixth opening area.

4. The light emitting apparatus according to claim 1, wherein the second hole is formed in part of a bottom surface of the first hole, and
   the fourth hole is formed in part of a bottom surface of the third hole.

5. The light emitting apparatus according to claim 4, wherein the bottom surface of the first hole and the bottom surface of the third hole are each a flat surface.

6. The light emitting apparatus according to claim 1, wherein the first light emitting section includes a plurality of first columnar sections each including a first light emitting layer, and
   the second light emitting section includes a plurality of second columnar sections each including a second light emitting layer.

7. A projector comprising the light emitting apparatus according to claim 1.

8. A light emitting apparatus comprising:
   a substrate;
   a first light emitting section provided on the substrate;
   a second light emitting section provided on the substrate;
   a first electrode provided on a side of the first light emitting section that is a side opposite from the substrate;
   a second electrode provided on a side of the second light emitting section that is a side opposite from the substrate;
   a first protective layer that covers the first light emitting section and the first electrode; and
   a second protective layer that covers the second light emitting section and the second electrode,
   wherein an area of the first electrode is greater than an area of the second electrode in a plan view viewed in a direction of a normal to the substrate,
   the first protective layer has a first through hole,
   the second protective layer has a second through hole,
   the first through hole has a first hole and a second hole located in a position shifted from the first hole toward the substrate,
   the second through hole has a third hole and a fourth hole located in a position shifted from the third hole toward the substrate,
   a first opening area of a first opening of the first hole, which is an opening farthest from the substrate, is greater than a second opening area of a second opening of the second hole, which is an opening closest to the substrate,
   a third opening area of a third opening of the third hole, which is an opening farthest from the substrate, is greater than a fourth opening area of a fourth opening of the fourth hole, which is an opening closest to the substrate, in the plan view, an outer edge of the second opening overlaps with the first electrode, and an outer edge of the fourth opening overlaps with the second electrode, the second opening area is greater than the fourth opening area, the first light emitting section includes a plurality of first columnar sections each including a first light emitting layer, and the second light emitting section includes a plurality of second columnar sections each including a second light emitting layer.

9. A projector comprising:

a light emitting apparatus, the light emitting apparatus including:
- a substrate;
- a first light emitting section provided on the substrate;
- a second light emitting section provided on the substrate;
- a first electrode provided on a side of the first light emitting section that is a side opposite from the substrate;
- a second electrode provided on a side of the second light emitting section that is a side opposite from the substrate;
- a first protective layer that covers the first light emitting section and the first electrode; and
- a second protective layer that covers the second light emitting section and the second electrode; and a projection lens configured to project image light from the light emitting apparatus, wherein an area of the first electrode is greater than an area of the second electrode in a plan view viewed in a direction of a normal to the substrate, the first protective layer has a first through hole, the second protective layer has a second through hole, the first through hole has a first hole and a second hole located in a position shifted from the first hole toward the substrate, the second through hole has a third hole and a fourth hole located in a position shifted from the third hole toward the substrate, a first opening area of a first opening of the first hole, which is an opening farthest from the substrate, is greater than a second opening area of a second opening of the second hole, which is an opening closest to the substrate, a third opening area of a third opening of the third hole, which is an opening farthest from the substrate, is greater than a fourth opening area of a fourth opening of the fourth hole, which is an opening closest to the substrate, in the plan view, an outer edge of the second opening overlaps with the first electrode, and an outer edge of the fourth opening overlaps with the second electrode, and the second opening area is greater than the fourth opening area.

\* \* \* \* \*